(12) United States Patent
Huang

(10) Patent No.: US 9,621,170 B2
(45) Date of Patent: Apr. 11, 2017

(54) ACCURATE FREQUENCY CONTROL USING A MEMS-BASED OSCILLATOR

(71) Applicant: Silicon Laboratories Inc., Austin, TX (US)

(72) Inventor: Yunteng Huang, Palo Alto, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/965,388

(22) Filed: Aug. 13, 2013

(65) Prior Publication Data

US 2015/0048895 A1 Feb. 19, 2015

(51) Int. Cl.
*H03L 7/099* (2006.01)
*H03L 7/02* (2006.01)
*H03L 1/02* (2006.01)
*H03L 7/06* (2006.01)

(52) U.S. Cl.
CPC .............. *H03L 1/028* (2013.01); *H03L 1/02* (2013.01); *H03L 1/026* (2013.01); *H03L 7/06* (2013.01)

(58) Field of Classification Search
CPC ......... H03L 1/022; H03L 1/026; H03L 1/027; H03L 7/06; H03L 1/02; H03L 1/028
USPC ........ 327/156; 331/1 R, 16, 34, 66, 70, 176; 375/376
See application file for complete search history.

(56) References Cited

U.S. PATENT DOCUMENTS

| | | | |
|---|---|---|---|
| 6,831,525 B1 | 12/2004 | Beaudin et al. | |
| 7,106,143 B2 | 9/2006 | Bloch et al. | |
| 7,211,926 B2 | 5/2007 | Quevy et al. | |
| 7,212,075 B2 | 5/2007 | Young et al. | |
| 7,215,214 B1* | 5/2007 | Taheri et al. | 331/107 A |
| 7,511,870 B2 | 3/2009 | Ho et al. | |
| 7,755,441 B1* | 7/2010 | Cioffi et al. | 331/154 |
| 7,760,036 B2 | 7/2010 | Sutardja | |
| 7,876,167 B1 | 1/2011 | McCraith et al. | |
| 7,982,550 B1 | 7/2011 | Quevy et al. | |
| 8,040,192 B2* | 10/2011 | Maeda | H03L 7/093 331/17 |
| 2003/0141867 A1 | 7/2003 | Inoue | |
| 2005/0151592 A1* | 7/2005 | Partridge et al. | 331/16 |
| 2006/0109059 A1 | 5/2006 | Skerritt | |
| 2007/0176705 A1 | 8/2007 | Sutardja | |
| 2010/0093125 A1 | 4/2010 | Quevy et al. | |
| 2011/0210797 A1 | 9/2011 | Quevy et al. | |
| 2012/0043999 A1* | 2/2012 | Quevy et al. | 327/147 |
| 2012/0182077 A1* | 7/2012 | Yamakawa et al. | 331/34 |

(Continued)

OTHER PUBLICATIONS

Zamora et al., "A 1.5mW, 200MHz CMOS VCO for Wireless Biotelemetry," Stanford University, 1997, 14 pages.

*Primary Examiner* — Richard Tan

(74) *Attorney, Agent, or Firm* — Zagorin Cave LLP

(57) ABSTRACT

A micro electro mechanical system (MEMS) oscillator supplies an oscillator output signal having a first frequency that differs from a predetermined frequency of the output signal. An error determination circuit determines frequency error from the predetermined frequency based on initial frequency offset and/or temperature and provides the error information indicating a difference between the first frequency and the predetermined frequency. The error information is used by a receiving system in frequency translation logic that utilizes the oscillator output signal as a frequency reference.

15 Claims, 4 Drawing Sheets

(56) References Cited

U.S. PATENT DOCUMENTS

2013/0113533 A1* 5/2013 Aaltonen .................. H03L 1/02
327/147
2013/0147567 A1* 6/2013 Yamakawa et al. .......... 331/154
2013/0285640 A1* 10/2013 Yamada ................... H03L 1/02
324/76.11

* cited by examiner

ACCURATE FREQUENCY CONTROL USING A MEMS-BASED OSCILLATOR

BACKGROUND

Field of the Invention

This invention relates to generating oscillating signals and more particularly to supplying an oscillator signal along with information related to its accuracy relative to a predetermined frequency.

Description of the Related Art

Modern electronic systems such as radios, tuners, micro controller units (MCUs), typically include a phase locked loop (PLL) (or other circuits) capable of doing frequency translation inside the system. A frequency reference signal is often supplied to the system. In the past, the frequency reference signal supplied to the system had a pre-determined fixed frequency obtained by precise manufacturing of crystal resonators or by electronically correcting error in the frequency with a frequency translation circuit such as a PLL. Errors associated with variations in temperature were addressed by tuning the resonator load or adjusting the frequency translation ratios resulting in a fixed frequency output.

Increasingly, Micro Electrical Mechanical System (MEMS) based oscillators are being used to generate the reference signal. MEMS generally refers to an apparatus incorporating a mechanical structure capable of movement. MEMS resonators have potential to displace traditional crystal (quartz) resonators as a source for frequency reference signals in various electronic systems. MEMS resonators have many advantages such as smaller size, a manufacturing flow compatible with high volume semiconductor industry manufacturing processes, and lower cost. One drawback to utilizing MEMS-based oscillators relates to frequency tuning Unlike quartz resonators whose frequency can be precisely controlled by cutting, MEMS resonator frequency has intrinsic initial frequency inaccuracy due to manufacturing tolerances. Also, unlike a crystal oscillator whose frequency can be pulled (adjusted) by adding or subtracting capacitance on the resonator node, it is very difficult to pull MEMS resonator frequency to offset the manufacturing tolerances. A fractional-N phase-locked loop (PLL) is often used to correct the inaccurate MEMS frequency to a pre-determined accurate fixed frequency using the frequency translation ratio of the PLL. Similarly, temperature stabilized MEMS oscillators require frequency correction for temperature effects.

FIG. 1 shows a prior art system in which a MEMS resonator 101 is combined with the MEMS oscillator sustaining circuit 102 to provide a MEMS oscillator signal 106 to frequency correction PLL 108. Frequency correction PLL 108 is typically implemented as a fractional-N PLL. The frequency error correction circuit 112 supplies error information to the PLL 108 to allow the PLL to correct for initial frequency offset of the MEMS resonator and temperature effects by ensuring the PLL 108 has the correct frequency translation ratio. The frequency correction PLL 108 supplies an accurate frequency reference signal 116 that has a pre-determined frequency known to the receiving system 130. The frequency reference signal 116 may be accurate to, e.g., 200 parts per billion or some other accuracy suitable for the receiving system. The receiving system utilizes the frequency reference signal 116 in frequency translation PLL 132 to generate a system clock 134 used by functional circuits 136 of the receiving system. The frequency translation PLL 132 translates the frequency reference signal 116 based on a desired frequency signal 138. That desired frequency signal may indicate to the frequency translation PLL 132 to multiply the reference frequency by, e.g., 117.6. Thus, the frequency translation PLL 132 may also be implemented as a fractional-N PLL to allow for non-integer ratios between the system clock 134 and the frequency reference signal 116.

However, there are multiple drawbacks to using a PLL in conjunction with a MEMS oscillator to generate the frequency reference signal 116. In particular, the PLL adds complexity, additional noise, and power consumption.

SUMMARY OF EMBODIMENTS OF THE INVENTION

In an embodiment an apparatus includes a Micro Electrical Mechanical System (MEMS) oscillator to supply a MEMS oscillator output signal and a frequency error determination circuit to supply a frequency error associated with the MEMS oscillator output signal.

In an embodiment, a method includes generating an oscillator output signal having a first frequency with a micro electro mechanical system (MEMS) oscillator. An error signal is determined indicating a difference between the first frequency and a predetermined frequency. The oscillator output signal and the error information is supplied to a receiving system. A frequency translation ratio of the oscillator output signal is determined in the receiving system based on the error information and on desired frequency information and a clock signal is generated in the frequency translation circuit based on the oscillator output signal and the frequency translation ratio. The clock signal is supplied to functional circuitry of the receiving system.

In another embodiment, an integrated circuit includes a micro electro mechanical system (MEMS) oscillator to supply an oscillator output signal having a first frequency. An error determination circuit provides error information indicating a difference between the first frequency and a predetermined frequency. One or more error output terminals of the integrated circuit are coupled to the error determination circuit to provide the error signal. A reference signal output terminal is coupled to provide the oscillator output signal.

In another embodiment an apparatus includes a first integrated circuit. The first integrated circuit includes a micro electro mechanical system (MEMS) oscillator to supply an oscillator output signal having a first frequency and an error determination circuit to provide an error signal indicating a difference between the first frequency and a predetermined frequency. A plurality of output terminals of the integrated circuit are coupled to the error determination circuit and the MEMS oscillator to provide the error signal and the oscillator output signal. The apparatus further includes a second integrated circuit that includes a plurality of input terminals to receive the error signal and the oscillator output signal and a frequency translation circuit to translate the oscillator output signal to a different frequency based on the error signal and a desired frequency indication.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Modern electronic systems such as radios, tuners, micro controller units (MCUs), typically include a fractional-N PLL (or other circuits) capable of doing frequency translation inside the system. A frequency reference signal is often supplied to the system. The system requiring the frequency reference signal may be incorporated onto a single silicon substrate providing a system on a chip (SoC) implementation. Rather than having a first PLL to correct errors associated with the MEMS resonator and a second PLL providing frequency translation for the receiving system, in an embodiment, the frequency translation of the MEMS oscillator reference signal that takes account of the errors in the MEMS signal is performed in a single PLL in the receiving system, e.g., the SoC system. Thus, in an embodiment the MEMS oscillator circuit provides two kinds of signals as opposed to just the oscillator output signal (the frequency reference signal). According to an embodiment, the frequency reference generation circuit provides a MEMS oscillator output signal and also supplies a signal that provides frequency error information associated with the MEMS oscillator output signal including temperature effects.

Figure 1:
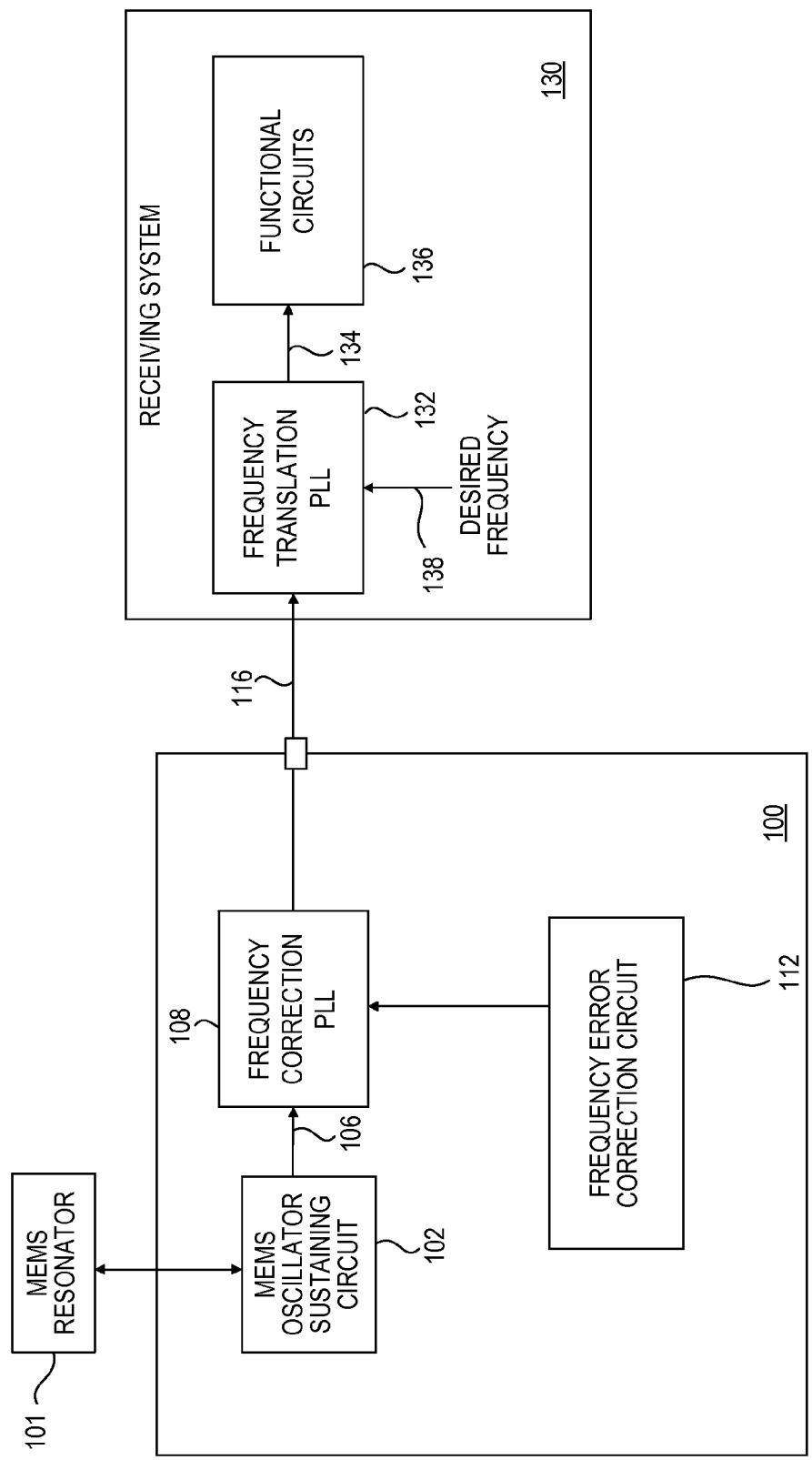
FIG. 1 illustrates a prior art system.
Figure 2:
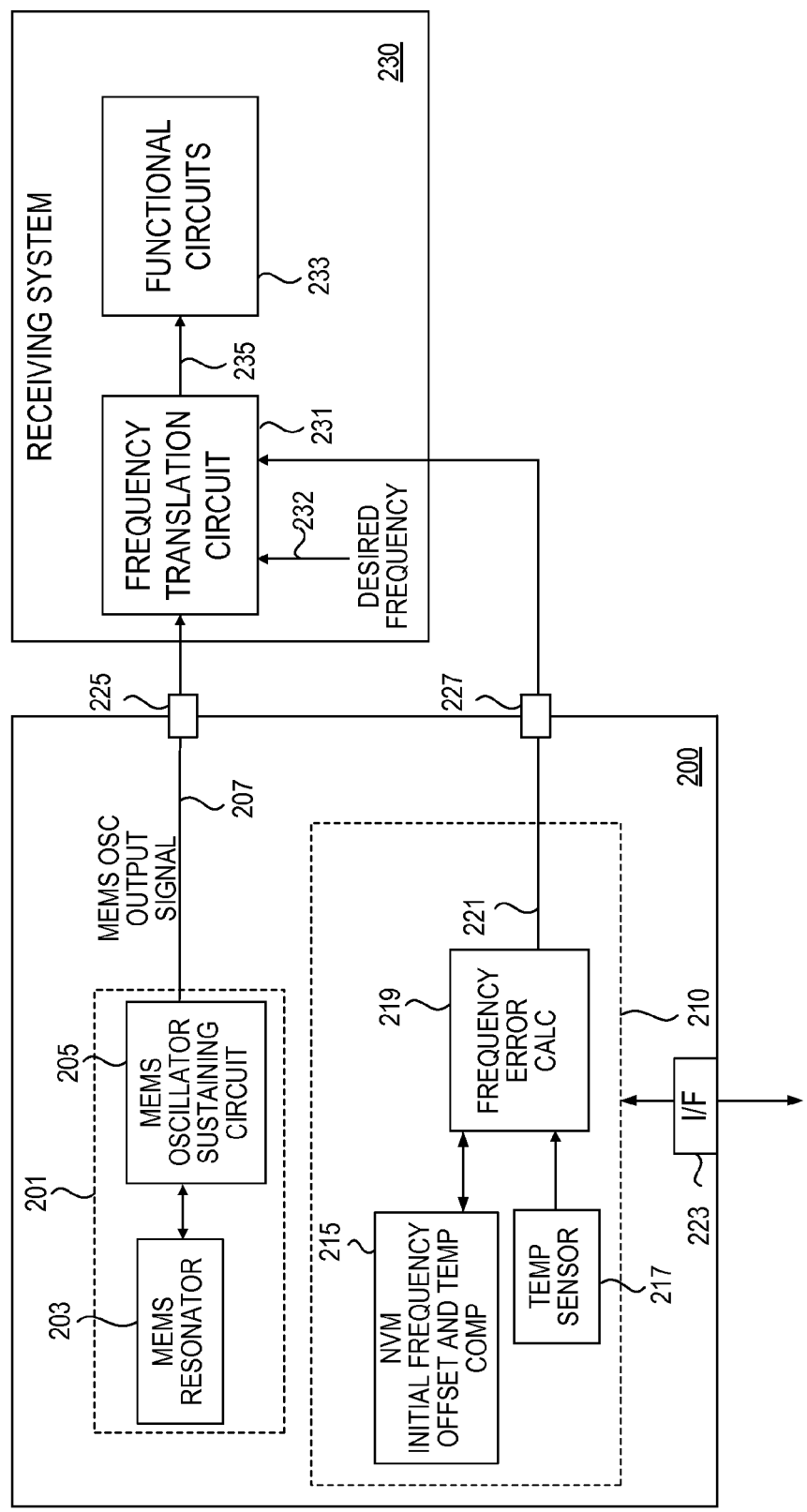
FIG. 2 illustrates an embodiment using a MEMS oscillator and a frequency error determination circuit to supply frequency error information along with the MEMS oscillator signal.

FIG. 2 illustrates an exemplary embodiment having MEMS oscillator 201. The MEMS oscillator 201 includes the MEMS resonator 203 and oscillator sustaining circuit 205 to sustain oscillation of the MEMS resonator. The MEMS oscillator 201 generates a MEMS oscillator output signal 207. The MEMS oscillator signal output 207 is typically 1~2% off from the target frequency for which the MEMS oscillator was designed, due to manufacturing tolerances. In addition, the MEMS oscillator is affected by temperature. Thus, two sources of error include the initial frequency offset and frequency changes resulting from variations in temperature.

Thus, in addition to the MEMS oscillator circuit 201, the illustrated embodiment includes a MEMS error determination circuit 210 that generates error information 221. The error information 221 is provided along with the MEMS oscillator output signal 207 so that an accurate clock signal can be generated downstream using the error signal in conjunction with desired frequency information that indicates a desired frequency of a system clock signal. The MEMS error determination circuit 210 in the illustrated embodiment includes a non-volatile memory (NVM) 215 that may be used to store the 1-2% frequency offset from the target frequency. The initial frequency offset may be determined by manufacturing calibration of the device.

MEMS oscillators can also be affected by temperature. Thus, a temperature sensor 217 may provide a sensed temperature that is provided to the frequency error calculation circuit 219. Temperature effects on the frequency of the oscillator output signal may also be determined during manufacturing testing. On-board heaters or ovens may be used to operate the device at different temperatures and determine how different temperatures affect the frequency of the oscillator output signal 207. The temperature information may be used in a variety of ways. In one embodiment, the frequency error calculation circuit 219 provides an index to a look-up table in NVM 215 based on the sensed temperature. The selected table entry provides the frequency error associated with the sensed temperature. That error may be stored in the NVM 215 as a percentage change or an absolute frequency change, with respect to, e.g., the initial frequency offset determined at a particular predetermined temperature, or may be stored in any appropriate manner to identify the error. In an embodiment temperature compensation is implemented as an equation representing a temperature curve, and one or more variables associated with a particular temperature may be stored in the memory and applied to determine the compensation required for a particular temperature. Thus, an equation may be utilized, e.g., a fifth order compensation curve, for frequency error versus temperature to determine the frequency compensation based on the temperature. In such an embodiment, the frequency error calculation logic 219 determines the frequency error using the compensation curve and provides that frequency error to the system that utilizes the frequency reference signal.

The frequency error calculation circuit 219 may be implemented, e.g., as a programmed microcontroller, in stand alone hardware, or in combination of a programmed microcontroller and other hardware. The initial frequency offset and the temperature error may be combined by the frequency error calculation circuit 219 to indicate offset from the target frequency as a percentage, an absolute frequency, or in any suitable manner and provided as error indication 221. For example, the initial frequency error of the MEMS oscillator may be 10 KHz slower than the target frequency. The error at a currently sensed temperature may cause the MEMS oscillator to run an additional 5 KHz slower. The combined error of 15 KHz may be provided as absolute frequency error information. Alternatively, the error information may indicate a relative percentage increase or decrease required of the current oscillator output signal frequency to achieve the target frequency. For some applications, this relative percentage can have very fine granularity such as parts per billion (ppb).

The MEMS oscillator 201 and error determination circuit 210 may be disposed on a single integrated circuit 200. The integrated circuit 200 may include output terminals 225 and 227 over which the oscillator output signal 207 and frequency error information 221 is provided to a receiving device 230.

Figure 3A:
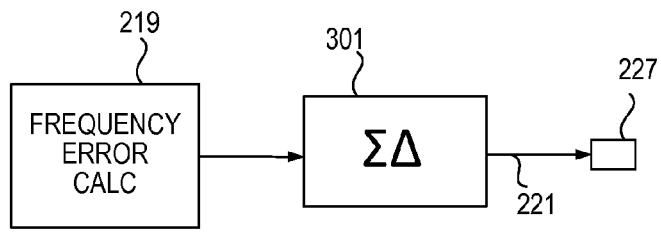
FIG. 3A illustrates the use of a sigma delta modulator to generate the frequency error information.
Figure 3B:
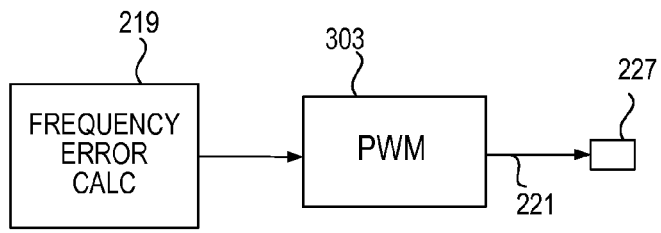
FIG. 3B illustrates an embodiment in which a pulse width modulator generates the frequency error information.
Figure 3C:
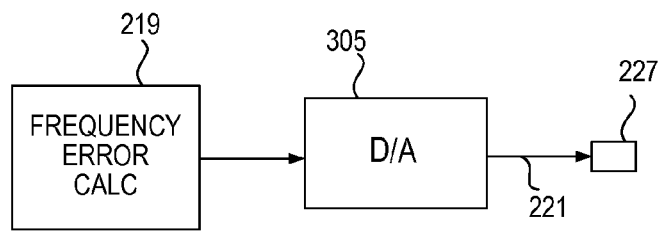
FIG. 3C illustrates an embodiment in which an analog signal is generated that provides the frequency error information.

In an embodiment the error information 221 is provided as a digital value. In an embodiment the scaling of the digital representation can be factory programmed or can be selected through a programming interface 223. Thus, the number of bits of resolution used to represent the frequency error can be selectable. The number of bits selected may depend on the capability of the receiving system and the accuracy required by the receiving system. In addition, the format of signal(s) carrying the error information 221 can vary in different embodiments. For example, in one embodiment, the output format of the error information 221 is a 1-bit stream from a sigma-delta modulator 301 supplied to output terminal 227 as shown in FIG. 3A. The receiving device 230 (see FIG. 2) averages the digital stream to get the frequency error information required for frequency correction. In another embodiment, the error signal is provided over a standard serial interface such as I²C® or other serial interface over one or more output terminals 227. In another embodiment, a pulse width modulated signal is provided by PWM logic 303 that represents the error signal and supplied to the output terminal 227 as shown in FIG. 3B. In another embodiment the frequency error information is provided in the form of an analog voltage level where the voltage level corresponds to the frequency error as shown in FIG. 3C. Thus, a digital value from the frequency error calculation logic 219 is converted to an analog signal in a digital to analog converter 305 and supplied to the output terminal 227. In still another embodiment, error information 221 is provided on a parallel interface and output terminal 227 in FIG. 2 represents a plurality of output terminals.

Referring again to FIG. 2, the receiving frequency translation circuit 231 adjusts the received reference frequency (oscillator output signal) to a clock signal having the desired frequency for functional circuitry 233 on the receiving system. The functional circuitry 233 includes a plurality of clocked circuits such as flip-flops that are coupled to the clock signal. The frequency translation circuit 231 utilizes the error information received by the receiving system in digital or analog form and the desired frequency to adjust the frequency to a desired frequency value. However, rather than receiving a known frequency reference signal (e.g., accurate with 200 parts per billion to a predetermined or target frequency), the receiving system receives a reference signal that has a variable frequency that can vary by 1-2% from initial frequency offset as well as vary due to temperature. Thus, the receiving system has to combine the error information and the desired frequency information in an appropriate manner to provide the desired frequency. For example, the system 230 may require a clock signal 235 that is 117.3 times faster than the target reference clock frequency. Since the reference frequency is off from the target frequency, that multiplication factor of 117.3 is adjusted by an appropriate amount up or down to account for the error present in the frequency of the received reference clock signal. For example, the error information may cause the 117.3 factor to be adjusted up or down by 1.23% to account for the inaccuracy in the reference clock frequency so that the frequency translation is accomplished as if the frequency reference signal was accurate. Thus, the receiving system determines an appropriate frequency translation for the reference signal based on the error information and the desired clock frequency. By using the receiving system PLL and providing the error information to the receiving system, an accurate clock signal 235 can be generated using the frequency translation PLL of the receiving system and the frequency correction PLL found in the prior art can be eliminated, thereby saving power, noise, and complexity. While a PLL is described in various embodiments herein, other frequency translation circuits can be used in accordance with the capabilities and requirements of the receiving system.

In an embodiment, the output format (serial, parallel, analog, etc.) is programmable, e.g., at the factory when the temperature compensation information and initial frequency offset is determined. The output format may be programmed via a control interface 223, and subsequently the programmed control bits may be stored in NVM to control the output format. In an embodiment control interface 223 is one or more input terminals and static voltage value(s) on the one or more input terminals determines programmable aspects of the error signal. Thus, attributes of the error signal may be pin programmable. The control interface may utilize the output terminal 227 during manufacturing calibration or testing or later when the device is part of a larger system.

Figure 4:
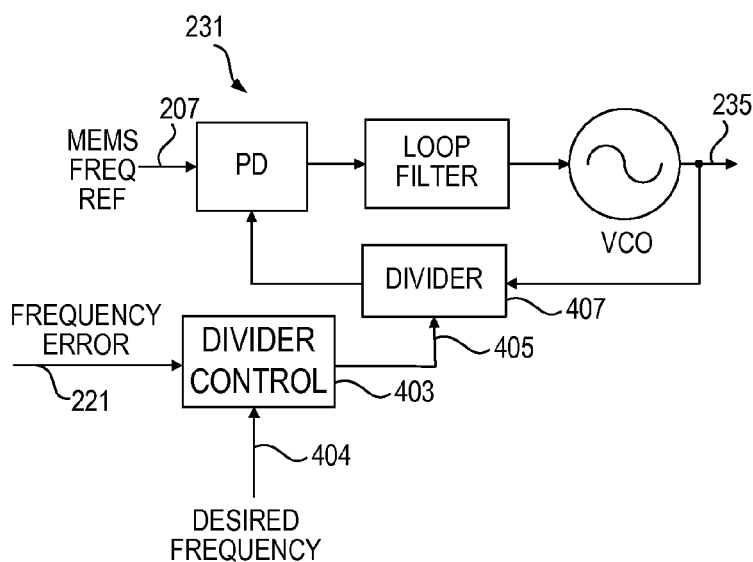
FIG. 4 illustrates an embodiment of a frequency translation PLL.

FIG. 4 illustrates one approach for generating a clock signal having a desired frequency using a fractional-N phase-locked loop as frequency translation circuit 231 to generate to the desired frequency. The use of the fractional-N PLL allows the frequency of the signal generated frequency to have a non-integer relationship with the reference frequency supplied from oscillator 201. A frequency setting is supplied to the divider control circuit 403 that may include a sigma delta modulator. The divider control circuit generates a divider control signal 405 for the divider 407 to allow the PLL to generate a frequency that is desired by the system based on the desired frequency signal 404. That divider control signal 405 also incorporates the error information 221 provided on one or more signal lines to the receiving circuit 230 (see FIG. 2). That allows the receiving system to account for errors in the reference signal due to temperature errors and/or initial offset. In that way, there is no need to duplicate PLLs.

Figure 5:
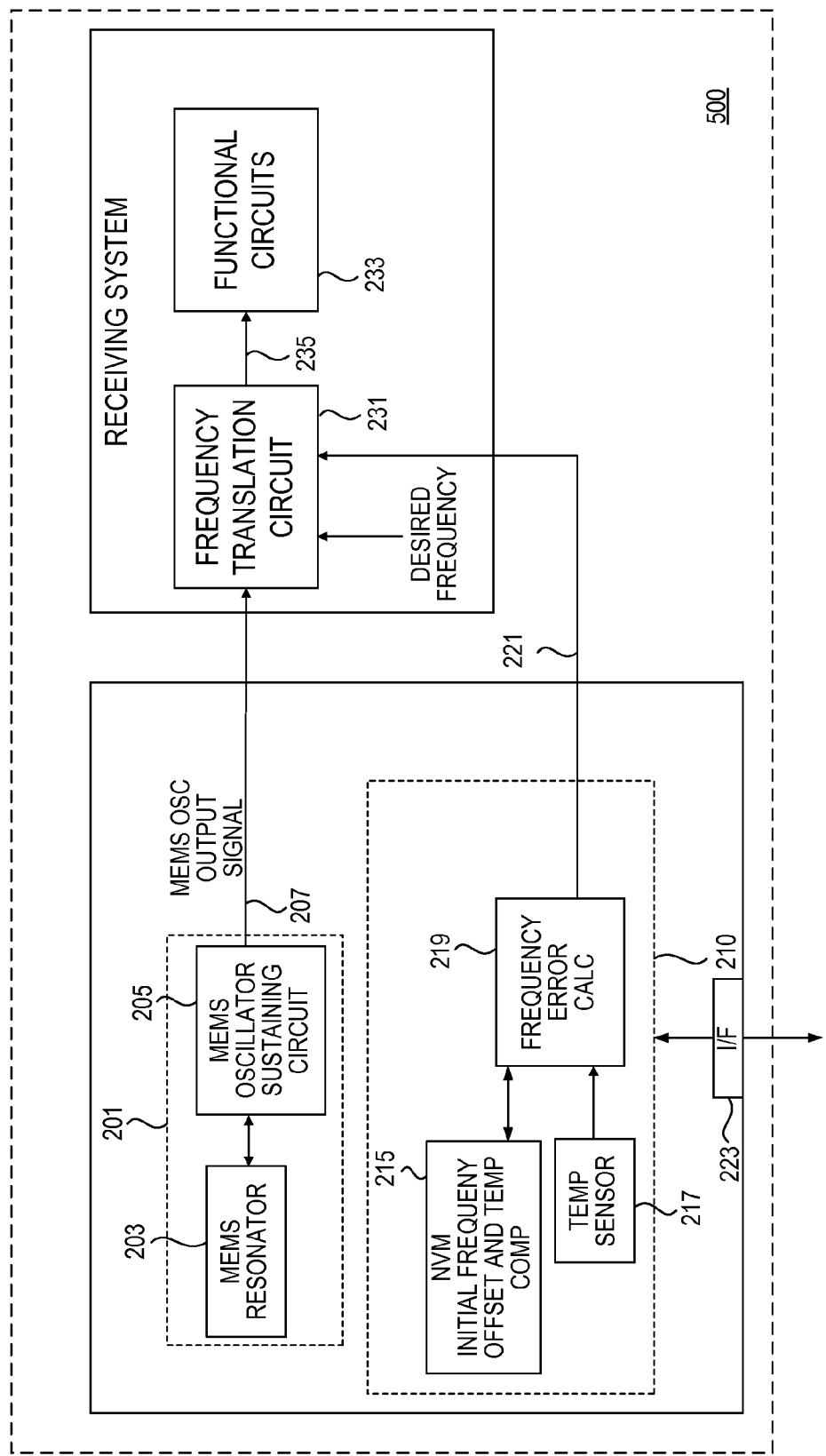
FIG. 5 illustrates an embodiment of where the MEMS oscillator and the frequency translation PLL are on the same integrated circuit.

FIG. 5 illustrates an embodiment where the reference clock generating circuitry including MEMS oscillator 201 and error logic 210 and the receiving system are on the same integrated circuit 500. The error information may be provided in any of the ways described herein (serially, PWM, analog) although output terminals 225 and 227 are not used in the embodiment of FIG. 5. The advantage of having a single PLL to provide both error correction and frequency translation based on a desired frequency is still present in the system shown in FIG. 5.

Thus, various approaches have been described that exploit a MEMS oscillator signal supplied along with frequency error information. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:
1. A method comprising:
selecting one or more attributes of error information through a programming interface, the one or more attributes including a selectable number of bits of resolution of the error information, the error information indicating a difference between a first frequency and a target frequency;
generating an oscillator output signal having the first frequency with a micro electro mechanical system (MEMS) oscillator on a first integrated circuit;
determining temperature in a temperature sensor and providing an indication of sensed temperature;
determining frequency error in the oscillator output signal due to temperature based on the indication of sensed temperature;
determining the error information by combining the frequency error determined based on the indication of sensed temperature and frequency error due to an initial frequency offset of the MEMS oscillator from the target frequency;

supplying the oscillator output signal and the error information from two or more output terminals of the first integrated circuit, to a receiving system on a second integrated circuit;

determining a frequency translation ratio of the oscillator output signal in the receiving system based on the error information and on desired frequency information;

generating a clock signal in a frequency translation circuit in the receiving system based on the oscillator output signal and the frequency translation ratio; and supplying the clock signal to functional circuitry of the receiving system.

2. The method as recited in claim 1 wherein the one or more attributes include an output format of the error information.

3. The method as recited in 1, further comprising providing the error information serially using at least one of the two or more output terminals.

4. The method as recited in claim 1, further comprising providing an analog indication of the error information wherein the analog indication is provided as a voltage, and wherein a voltage level of the analog indication corresponds to the error information.

5. An integrated circuit comprising:
a micro electro mechanical system (MEMS) oscillator to supply an oscillator output signal having a first frequency;
an error determination circuit to provide error information indicating a difference between the first frequency and a predetermined frequency;
one or more error output terminals of the integrated circuit coupled to the error determination circuit to provide the error information;
a programming interface to select one or more attributes of the error information, the one or more attributes including a selectable number of bits of resolution of the error information; and
a reference signal output terminal of the integrated circuit to provide the oscillator output signal.

6. The integrated circuit as recited in claim 5 wherein the one or more attributes include an output format of the error information.

7. The integrated circuit as recited in claim 5 further comprising one or more input terminals providing the programming interface, wherein respective static voltage values on the one or more input terminals determines the one or more attributes of the error information.

8. The integrated circuit as recited in 5 wherein the one or more error output terminals comprise a serial interface coupled to the error determination circuit to provide the error information over the serial interface.

9. The integrated circuit as recited in claim 5, wherein the one or more error output terminals comprise an output terminal coupled to the error determination circuit to provide an analog indication of the error information, the analog indication being provided as a voltage level corresponding to the error information.

10. The integrated circuit as recited in claim 5 wherein the error information includes an initial frequency offset of the oscillator output signal from the predetermined frequency.

11. The integrated circuit as recited in claim 5, further comprising:
a temperature sensor to provide an indication of sensed temperature;
a non-volatile memory storing information corresponding to initial frequency offset and frequency error due to temperature; and
wherein the error determination circuit is coupled to the temperature sensor and the non-volatile memory and is configured to provide the error information based on frequency error due to temperature and the initial frequency offset.

12. The integrated circuit as recited in claim 5, further comprising:
a sigma delta modulator coupled to the error determination circuit; and
wherein the one or more error output terminals comprise an output terminal coupled to the sigma delta modulator provide a one bit stream from the sigma delta modulator as the error information.

13. The integrated circuit as recited in claim 5 further comprising:
a temperature sensor supplying temperature information; and
wherein the error determination circuit is further configured to generate the error information based on the temperature information and an initial frequency offset of the MEMS oscillator from the predetermined frequency.

14. The apparatus integrated circuit as recited in claim 13 further comprising non-volatile memory storing the initial frequency offset.

15. An apparatus comprising:
a first integrated circuit including,
a micro electro mechanical system (MEMS) oscillator to supply an oscillator output signal having a first frequency;
an error determination circuit to provide error information indicating a difference between the first frequency and a predetermined frequency, the error determination circuit is configured to calculate the error information based on initial frequency offset, sensed temperature, and temperature compensation information;
one or more error output terminals of the integrated circuit coupled to the error determination circuit to provide the error information;
a reference signal output terminal of the integrated circuit to provide the oscillator output signal;
pulse width modulation logic coupled to the error determination circuit;
wherein the one or more error output terminals provide a pulse width modulated signal as the error information;
a second integrated circuit including,
a frequency translation circuit coupled to receive the error information, information relating to a desired frequency, and the oscillator output signal and supply a frequency translation output signal having the desired frequency.

* * * * *

UNITED STATES PATENT AND TRADEMARK OFFICE
CERTIFICATE OF CORRECTION

PATENT NO. : 9,621,170 B2
APPLICATION NO. : 13/965388
DATED : April 11, 2017
INVENTOR(S) : Yunteng Huang Page 1 of 1

It is certified that error appears in the above-identified patent and that said Letters Patent is hereby corrected as shown below:

In Column 8, Line 30, please delete "apparatus".

Signed and Sealed this
Sixteenth Day of May, 2017

Michelle K. Lee
*Director of the United States Patent and Trademark Office*